(12) United States Patent
Sato

(10) Patent No.: US 10,573,792 B2
(45) Date of Patent: Feb. 25, 2020

(54) LED PACKAGE, BACKLIGHT UNIT AND LIQUID CRYSTAL DISPLAY DEVICE

(71) Applicant: LG DISPLAY CO., LTD., Seoul (KR)

(72) Inventor: Osamu Sato, Tokyo (JP)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/873,875

(22) Filed: Oct. 2, 2015

(65) Prior Publication Data
US 2016/0104825 A1  Apr. 14, 2016

(30) Foreign Application Priority Data

Oct. 8, 2014 (JP) ................................ 2014-206986

(51) Int. Cl.
| | | |
|---|---|---|
| H01L 33/50 | (2010.01) | |
| H01L 33/48 | (2010.01) | |
| H01L 33/56 | (2010.01) | |
| H01L 33/60 | (2010.01) | |
| G02F 1/1335 | (2006.01) | |

(52) U.S. Cl.
CPC ...... *H01L 33/504* (2013.01); *G02F 1/133603* (2013.01); *H01L 33/486* (2013.01); *H01L 33/56* (2013.01); *H01L 33/60* (2013.01)

(58) Field of Classification Search
CPC .... H01L 33/504; H01L 33/507; H01L 33/505
See application file for complete search history.

(56) References Cited

U.S. PATENT DOCUMENTS

| | | | | |
|---|---|---|---|---|
| 7,445,354 | B2 * | 11/2008 | Aoki | H01L 33/486 257/100 |
| 8,957,401 | B2 * | 2/2015 | Pickett | C09K 11/02 257/13 |
| 2004/0076016 | A1 * | 4/2004 | Sato | H01L 33/20 365/555 |
| 2004/0095063 | A1 * | 5/2004 | Murazaki | H01L 33/38 313/503 |
| 2005/0098472 | A1 * | 5/2005 | Rissing | G01D 5/34707 206/706 |
| 2007/0096113 | A1 * | 5/2007 | Inoshita | H01L 33/507 257/79 |
| 2008/0023714 | A1 * | 1/2008 | Chae | H01L 33/507 257/98 |
| 2008/0203419 | A1 * | 8/2008 | Harada | H01L 25/0753 257/98 |
| 2009/0261708 | A1 * | 10/2009 | Moseri | H01L 33/56 313/501 |
| 2009/0309116 | A1 * | 12/2009 | Kato | C09K 11/7721 257/98 |
| 2010/0123155 | A1 * | 5/2010 | Pickett | B82Y 15/00 257/98 |

(Continued)

FOREIGN PATENT DOCUMENTS

| | | |
|---|---|---|
| JP | 09-511844 A | 11/1997 |
| JP | 2007-067184 A | 3/2007 |

(Continued)

*Primary Examiner* — Bac H Au
(74) *Attorney, Agent, or Firm* — Dentons US LLP

(57) ABSTRACT

Disclosed is a light emitting diode package that includes: a frame having a light emitting diode (LED) thereon; and a glass cell over the LED, the glass cell including a quantum dot dispersed in one of a resin and an organic solvent.

13 Claims, 2 Drawing Sheets

(56) References Cited

U.S. PATENT DOCUMENTS

| | | | |
|---|---|---|---|
| 2011/0096529 A1* | 4/2011 | Wheatley | G02B 6/0046 362/97.1 |
| 2011/0280032 A1* | 11/2011 | Kishimoto | B82Y 20/00 362/538 |
| 2011/0303940 A1* | 12/2011 | Lee | H01L 33/54 257/98 |
| 2011/0309325 A1* | 12/2011 | Park | H01L 25/0753 257/13 |
| 2011/0317397 A1* | 12/2011 | Trottier | H01L 33/502 362/84 |
| 2012/0138983 A1* | 6/2012 | Chang | H01L 33/504 257/98 |
| 2012/0267659 A1* | 10/2012 | Chou | H01L 33/505 257/98 |
| 2012/0286319 A1* | 11/2012 | Lee | H01L 33/642 257/99 |
| 2013/0043499 A1* | 2/2013 | Ohta | H01L 33/483 257/98 |
| 2013/0094176 A1 | 4/2013 | Deeman et al. | |
| 2013/0181243 A1* | 7/2013 | Wu | H01L 33/505 257/98 |
| 2014/0021503 A1* | 1/2014 | Yoshida | H01L 33/507 257/98 |
| 2014/0103798 A1 | 4/2014 | Yamanaka et al. | |
| 2014/0151721 A1* | 6/2014 | Orsley | H01L 33/648 257/88 |
| 2014/0158982 A1* | 6/2014 | Park | G02B 6/005 257/13 |
| 2014/0226308 A1* | 8/2014 | Fukuda | H01L 33/507 362/84 |
| 2015/0048408 A1* | 2/2015 | Nam | H01L 33/486 257/99 |
| 2015/0137163 A1* | 5/2015 | Harris | H01L 33/483 257/98 |
| 2015/0214445 A1* | 7/2015 | Qiu | H01L 27/15 257/88 |
| 2017/0051892 A1* | 2/2017 | Blees | B28B 1/24 |

FOREIGN PATENT DOCUMENTS

| | | |
|---|---|---|
| JP | 2007-173754 A | 7/2007 |
| JP | 2010-507880 A | 3/2010 |
| JP | 2011-108889 A | 6/2011 |
| JP | 2012-114336 A | 6/2012 |
| JP | 2012-191144 A | 10/2012 |
| JP | 2013-115351 A | 6/2013 |
| JP | 2013153105 A | 8/2013 |
| JP | 2014-154644 A | 8/2014 |
| KR | 10-2012-0111369 A | 10/2012 |
| KR | 10-2013-0015847 A | 2/2013 |
| KR | 10-2013-0136259 A | 12/2013 |
| WO | 2012-132232 A1 | 10/2012 |
| WO | 2012-132236 A1 | 10/2012 |
| WO | 2013/001687 A1 | 1/2013 |
| WO | 2013171610 A1 | 11/2013 |

* cited by examiner

LED PACKAGE, BACKLIGHT UNIT AND LIQUID CRYSTAL DISPLAY DEVICE

This application claims the benefit of Japanese Patent Application No. 2014-206986, filed on Oct. 8, 2014, which is hereby incorporated by reference for all purposes as if fully set forth herein.

BACKGROUND OF THE INVENTION

Field of the Invention

The present invention relates to a light emitting diode (LED) package. More particularly, the present invention relates to a backlight unit including an LED package and a liquid crystal display device including the backlight unit.

Discussion of the Related Art

An LED package where an LED is mounted on a frame has been used as a light source of a lighting apparatus and a liquid crystal display (LCD) device.

In general, the LED of the LED package includes a semiconductor having a positive-negative (pn) junction of a p-type semiconductor material and an n-type semiconductor material. A wavelength of a light emitted from the LED may be adjusted according to a kind of a compound for the semiconductor.

Since the LED has a low power consumption and a small size as compared with another light source, the LED may be suitable for the LCD device. The LED emitting a white light has been used for a conventional LED package of the LCD device. For example, the LED package (e.g., Patent Document 1: Japanese Publication No. 2014-154644) including a plurality of LEDs emitting different colored lights and the LED package (e.g., Patent Document 2: Japanese Publication No. 2007-067184) including an LED and a fluorescent material combined to the LED may be used.

As an organic light emitting diode (OLED) display device is put to practical use, a color reproducibility of the LCD device becomes crucial. A color display of the LCD device is obtained by absorbing a light of a partial wavelength band from a light emitted from a white colored light source with a color filter. For the purpose of improving the color reproducibility of the LCD device, it is effective to decrease the wavelength band of the light passing through the color filter. However, when the wavelength band of the light passing through the color filter decreases, a problem such that utilization efficiency of the light is reduced occurs. To solve the above problem, it is required that the light source emits a light having a narrow wavelength bands corresponding to three primary colors of light and the wavelength bands of light passing through the color filter is matched with the wavelength bands of the light emitted from the light source.

Accordingly, a quantum dot (QD) has been used as a fluorescent material combined to the LED (e.g., Patent Document 3: Japanese Publication No. 2012-191144)

The quantum dot uses light from the LED as an excitation source and emits light with a longer wavelength than that of the excitation source. In addition, the wavelength of the light emitted from the quantum dot can be controlled by changing the type and the size of the quantum dot. Moreover, the quantum dot has high quantum efficiency approaching that of YAG (yttrium aluminum garnet) fluorescent material. Therefore, it is possible to obtain an LED package having desired emission color, high brightness and emission spectrum with a narrow full width at half maximum (FWHM) by using the quantum dot. Furthermore, it is possible to manufacture an LCD device having wide color gamut by using an LED package of the quantum dot as a light source of the backlight unit.

However, there is a problem that the quantum dot is degraded in a short time when it receives a light from the LED in the presence of moisture and oxygen. Additionally, when the quantum dot is disposed adjacent to the LED of the excitation source, the degradation of the quantum dot is accelerated in circumstances of large amount of light and high temperature.

SUMMARY OF THE INVENTION

Accordingly, the present invention is directed to an LED package including an LED and a quantum dot, a backlight unit including the LED and an LCD device including the backlight unit that substantially obviate one or more of the problems due to limitations and disadvantages of the related art.

An advantage of the present invention is to provide an LED package which has a desired emission color, a high brightness, a narrow FWHM of an emission spectrum and a long lifetime by preventing degradation of a quantum dot.

Another advantage of the present invention is to provide a backlight unit and an LCD device which have an improved range of color reproducibility due to the LED package.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a light emitting diode package includes: a frame having a light emitting diode (LED) thereon; and a glass cell over the LED, the glass cell includes a quantum dot dispersed in one of a resin and an organic solvent.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Figure 1A:
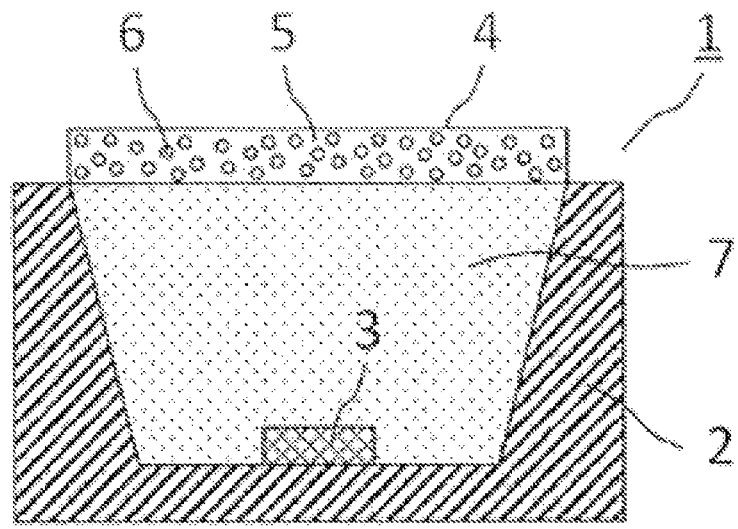
FIGS. 1A and 1B are cross-sectional views showing a light emitting diode package according to embodiments of the present invention.
Figure 1B:
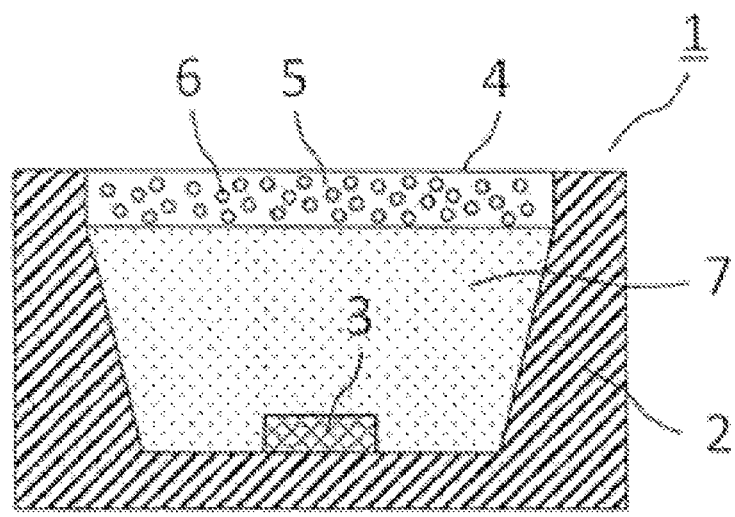
Figure 2:
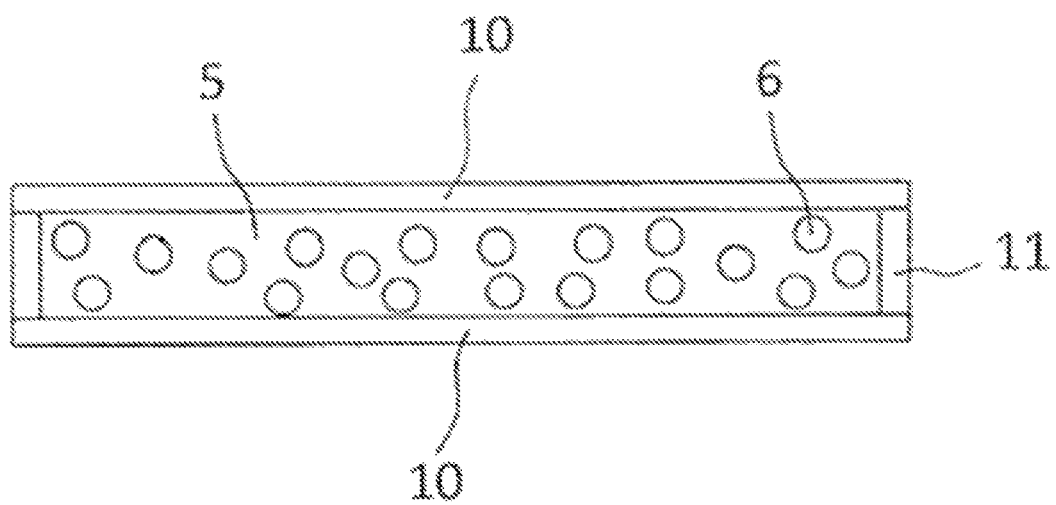
FIG. 2 is a cross-sectional view showing a glass cell of a light emitting diode package according embodiments of the present invention.

FIGS. 1A and 1B are cross-sectional views showing a light emitting diode package according to embodiments of the present invention, and FIG. 2 is a cross-sectional view showing a glass cell of a light emitting diode package according embodiments of the present invention.

In FIGS. 1A and 1B, a light emitting diode (LED) package 1 includes a frame 2, an LED 3 mounted on the frame 2 and a glass cell 4 over the LED 3.

The frame 2 is not particularly limited if it is possible to mount the LED 3, and a frame publicly known in the art can be used.

Although a material for the frame 2 is not particularly limited, a resin selected from polycarbonate (PC), polyphthalamide, nylon (registered trademark), polyethylene terephthalate, polybutylene terephthalate, polycarbonate/acrylonitrile butadiene styrene (PC/ABS) alloy, etc. may be used for the frame 2.

Although a shape of the frame 2 is not particularly limited, it is beneficial that the frame 2 has a concave portion in a package and an emission efficiency. Especially, the emission efficiency may be improved by the concave portion having an upper diameter larger than a lower diameter and an inclined side surface. The frame 2 having the above-mentioned shape may be fabricated by a method publicly known in the art such as an injecting molding, etc.

In addition, it is beneficial that the frame 2 has a reflective type or a reflecting plate is formed on a surface of the frame 2 where the LED 3 is mounted. Since a light from the LED 3 is effectively incident to the glass cell 4 in the above-mentioned structure, the emission efficiency is improved. Further, although the reflecting plate on the surface of the frame 2 is not particularly limited, a metal plate having a relatively high reflectance may be used as the reflecting plate.

The LED 3 on the frame 2 is not particularly, and an LED publicly known in the art such as a blue LED, a green LED and a red LED may be used as the LED 3. When a white colored light is obtained by combination of a light from the LED 3 and a light from the quantum dot 6, it is beneficial that the LED 3 is a blue LED. Although not shown, the LED 3 is connected to a lead electrode and emits a light by application of an electrical signal from the lead electrode.

The glass cell 4 over the LED 3 includes a quantum dot 6 dispersed in a resin or an organic solvent 5.

In the description, the 'glass cell 4' means a glass member having an interior space that can be filled with the resin or organic solvent 5 where the quantum dot 6 is dispersed as a layer. More specifically, the glass cell 4 includes at least two glass plates and has a structure that the layered interior space is formed between the two glass substrates. For example, as shown in FIG. 2, the glass cell 4 has a structure that a glass wall 11 is interposed between two glass plates 10 facing and spaced apart from each other. The shape of the glass plates 10 is not limited to a plane shape, and the glass plates 10 may have a curved shape.

In the description, the 'quantum dot 6' is a nanoscale material that has an optical property according to quantum mechanics and means a very small-sized semiconductor particle that has a diameter of generally 1 nm~100 nm, beneficially 1 nm~50 nm, and more beneficially 1 nm~20 nm. The quantum dot 6 absorbs a photon having an energy larger than a band gap energy (an energy difference between a valence band and a conduction band) and emits a light having a wavelength corresponding to a diameter thereof. Accordingly, the quantum dot 6 absorbs a light having a wavelength smaller than a predetermined wavelength and may emit a light having various wavelengths by controlling a diameter thereof.

In general, the quantum dot 6 includes at least one semiconductor material. Although the semiconductor material is not particularly limited, the semiconductor material may include an element of Group IV, a compound of Group II-VI, a compound of Group II-V, a compound of Group III-VI, a compound of Group III-V, a compound of Group IV-VI, a compound of Group I-III-VI, a compound of Group II-IV-VI, a compound of Group II-IV-V, etc. Specifically, the semiconductor material may include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AN, AlP, AlSb, TlN, TlP, TlAs, TlSb, PbO, PbS, PbSe, PbTe, Ge, Si, etc.

Moreover, the quantum dot 6 may have a core-shell structure that is composed of a core including at least one semiconductor materials and a shell including at least one semiconductor material. Specifically, the quantum dot 6 may have CdSe as the core and CdZnS as the shell (red emission), may have CdZnSe as the core and CdZnS as the shell (green emission), and may have CdS as the core and CdZnS as the shell (blue emission).

Although the quantum dot 6 has a spherical shape in FIGS. 1A and 1B, the shape of the quantum dot 6 is not limited to the spherical shape, and the quantum dot 6 may have various shapes such as a rod shape, a plate shape, etc.

The quantum dot 6 having the above-mentioned features may be publicly known in the art and may be fabricated by a publicly-known method.

The resin for dispersing the quantum dot 6 is not particularly limited, and a resin publicly known in the art can be used for dispersing the quantum dot 6. It may be beneficial to use an epoxy resin, an urea resin and a silicone resin, which have an excellent dispersibility of the quantum dot 6 and an excellent blocking property for moisture and oxygen as the resin.

The organic solvent for dispersing the quantum dot 6 is not particularly limited, and an organic solvent publicly known in the art can be used. It may be beneficial to use an organic solvent having a relatively high boiling point (desirably, a boiling point equal to or more than 100 degrees Celsius) such that the quantum dot 6 is well dispersed. For example, the organic solvent may include toluene, styrene, xylene, etc.

A shape of the glass cell 4 containing the quantum dot 6 dispersed in the resin or organic solvent 5 may be properly determined according to the shape of the concave portion of the frame 2 and is not particularly limited. Specifically, it is beneficial that glass cell 4 has a structure corresponding to the shape of the concave portion (opening) of the frame 2.

In addition, it is beneficial that the glass cell 4 does not directly contact the LED 3. Since the surface of the LED 3 has a relatively high temperature, the reduction in a fluorescence efficiency caused by degradation of the quantum dot 6 due to heat generated from the LED 3 can be prevented by placing the glass cell 4 separately from the LED 3.

When the glass cell 4 is placed separately from the LED 3, a space 7 is disposed between the LED 3 and the glass cell 4 as shown in FIGS. 1A and 1B.

Moreover, the glass cell 4 may be placed in the concave portion of the frame 2 as shown in FIG. 1A, or the glass cell 4 may be disposed over the concave portion of the frame 2 as shown in FIG. 1B.

In the glass cell 4, the quantum dot 6 absorbs a light from the LED 3 and a light having a wavelength longer than that of the light from the LED 3 as a result of excitation of the quantum dot 6. As a result, a desired emission color can be realized by controlling the type of the LED 3 and the type and number of the quantum dot 6. Particularly, when a white colored light is realized, it is beneficial that the LED 3 is a blue LED and the quantum dot 6 includes a first quantum dot, which is excited by a blue light (absorbing a blue light) and emits a light having a peak wavelength within a range of 510 nm~610 nm, desirably, 520 nm~580 nm, and a second quantum dot, which is excited by a blue light (absorbing a blue light) and emits a light having a peak wavelength within a range of 600 nm~700 nm, desirably, 610 nm~680 nm. Accordingly, the white colored light can be realized by the combination of a blue light from the blue LED, a green light from the first quantum dot, and a red light from the second quantum dot.

Although it does not matter that the space 7 between the glass cell 4 and the LED 3 may be air itself, the space 7 may be filled with an inert gas such as nitrogen or a sealing resin. The sealing resin is not particularly limited, and a resin publicly known in the art can be used. Additionally, the sealing resin may be the same as the resin for dispersing the quantum dot 6.

Furthermore, the space 7 may be filled with a sealing resin where particles are dispersed. Since a light from the LED 3 can be scattered by using the sealing resin where minute particles are dispersed, a light is uniformly irradiated onto the quantum dot 6 and a light can be uniformly emitted from the quantum dot 6. The particles are not particularly limited, and particles publicly known in the art can be used.

Although not essential, a polarizing plate may be disposed over the glass cell 4. Since the polarizing plate transmits a light vibrating along a predetermined direction, the LED package 1 including the polarizing plate may be used for a unit requiring a light vibrating along a predetermined direction (for example, a backlight unit).

In addition, the frame 2 of a reflective type is used or the reflecting plate is disposed on the surface of the frame 2 where the LED 3 is mounted, and the polarizing plate of a reflective type may be used. In the above-mentioned structure, a light reflected by the polarizing plate of a reflective type is reflected again by the frame 2 of a reflective type or the reflecting plate such that a polarization state is changed. A light recycling structure where a light passes through the polarizing plate of a reflective type with an efficiency of almost 100% by repeating reflections may be obtained.

Since the LED package 1 having the above-mentioned structure emits a desired colored light, a relatively high brightness and a relatively long lifetime, the LED package 1 may be used for a backlight unit and an LCD device.

Hereinafter, the present invention is described in detail by an exemplary embodiment and a comparative example but is not limited on these.

Embodiment 1

The LED package having the structure of FIG. 1A is manufactured. In the LED package 1, a blue LED and the mixture of a first quantum dot and a second quantum dot, where the first quantum dot is excited by a blue colored light (absorbing a blue colored light) to emit a green colored light and the second quantum dot is excited by a blue colored light (absorbing a blue colored light) to emit a red colored light are used for the LED package 1. Moreover, a silicone resin is used for dispersing the quantum dot. Furthermore, the first quantum dot and the second quantum dot are mixed at a ratio such that the blue colored light from the blue LED, the green colored light from the first quantum dot, and the red colored light from the second quantum dot are combined to produce the white colored light.

Next, a reliability test is performed for the LED package 1. The reliability test is performed by disposing the LED package 1 in a thermo-hygrostat, which is set under the conditions with the temperature of 60 degrees Celsius and a relative humidity of 90%, flowing currents of 20 mA through the LED to light the LED package 1 for 1026 hours, and measuring variation in total luminous flux and chromaticity of the LED at that time. As a result, as compared with the initial value after 1026 hours, the variation in the total luminous flux was +1%, and the variation in the chromaticity was −0.012 at Cx and −0.001 at Cy.

In addition, the color reproducibility test is performed for an LCD device including the LED package 1 and an LCD device including a comparative LED package where YAG (yttrium aluminum garnet) is used as a fluorescent material. The two types of LCD devices have the same structure except for light sources. As a result of measurements, the color gamut of the LCD device including the comparative LED package using YAG phosphor as a light source is about 72% of NTSC while the color gamut of the LCD device including the LED package 1 is about 96% of NTSC.

Comparative Example 1

The comparative LED package is manufactured which has the same structure as that of embodiment 1 except for omission of the upper glass plate of the glass cell 4.

Next, a reliability test is performed for the comparative LED package. The reliability test is performed by disposing the comparative LED package in a thermo-hygrostat, which was set under the conditions with the temperature of 60 degrees Celsius and the relative humidity of 90%, flowing currents of 20 mA through the LED to light the comparative LED package for 1010 hours, and measuring variation in total luminous flux and chromaticity of the LED at that time like embodiment 1. As a result, as compared with the initial value after 1010 hours, the variation in the total luminous flux was −8%, and the variation in the chromaticity was −0.075 at Cx and −0.117 at Cy.

Comparative Example 2

A sheet including two barrier films having a water-vapor-transmission-rate (WVTR) of $10^{-2}$ g/cm² day and a quantum dot dispersed in a resin between the two barrier films is disposed over a backlight unit of an edge light type, and a reliability test is performed for the backlight unit. The reliability test is performed by disposing the backlight unit including the sheet in a thermo-hygrostat, which was set under the conditions with the temperature of 65 degrees Celsius and the relative humidity of 75%, and irradiating a blue colored light onto the sheet having the quantum dot for 1013 hours. The irradiation amount of the blue colored light is 12000 cd/m². As a result, as compared with the initial value after 1013 hours, the variation in the total luminous flux was −68%, and the variation in the chromaticity was −0.115 at Cx and −0.351 at Cy.

Comparing the result of embodiment 1 and the result of comparative examples 1 and 2, it is noted that the variations in the total luminous flux and the chromaticity of the LED package 1 of embodiment 1 is considerably reduced as compared with the LED package of comparative examples 1 and 2. Further, a color reproduction range of the LCD device using the LED package 1 of embodiment 1 as a light source is drastically enlarged as compared with the LCD device using the LED package including the conventional YAG fluorescent material as a light source.

From these results, according to the present invention, it is possible to provide an LED package which prevents the degradation of the quantum dot and has the desired emission color, the relatively high brightness, the emission spectrum with a relatively narrow FWHM and the relatively long lifetime by using a glass cell having a quantum dot dispersed in a resin or an organic solvent. In addition, it is possible to provide an LCD device where a color reproduction range is drastically enlarged as compared with a conventional LCD device by using the LED package as a light source for a backlight unit.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode package comprising:
   a reflective frame having a light emitting diode (LED) thereon; and
   a glass cell over the LED, the glass cell including a quantum dot dispersed in one of a resin and an organic solvent,
   wherein the reflective frame includes a concave portion and a bottom surface on which the LED is mounted,
   wherein the glass cell is disposed inside the concave portion of the reflective frame,
   wherein a whole of the glass cell is disposed inside the concave portion of the reflective frame such that a top surface of the glass cell is flush with a top surface of a sidewall of the reflective frame,
   wherein an entire space between the LED and the glass cell is filled with an inert gas,
   wherein an inner side surface of the reflective frame has a vertical portion and a slanting portion that does not include a step or protrusion, and a length of a bottom surface of the glass cell is substantially the same as a length of a top surface of the space between the LED and the glass cell,
   wherein the vertical portion and the slanting portion of the inner side surface of the reflective frame are directly connected to each other without any intervening horizontal step portion such that the glass cell has a structure corresponding to the shape of the concave portion of the reflective frame, and
   wherein a lower edge of the glass cell is disposed at a connecting point of the vertical portion and the slanting portion such that a whole of a lower surface of the glass cell is exposed to the space between the LED and the glass cell.

2. The LED package according to claim 1, wherein the glass cell is spaced apart from the LED.

3. The LED package according to claim 1, wherein the quantum dot includes at least two types of quantum dots emitting different wavelengths from each other.

4. The LED package according to claim 1, wherein the LED emits a blue colored light, and the quantum dot includes a first quantum dot which is excited by the blue colored light and emits a light having a peak wavelength within a range of 510 nm to 610 nm, and a second quantum dot which is excited by the blue colored light and emits a light having a peak wavelength within a range of 600 nm to 700 nm.

5. The LED package according to claim 1, wherein the resin where the quantum dot is dispersed is at least one selected from a group including an epoxy resin, a urea resin and a silicone resin.

6. The LED package device according to claim 1, wherein a polarizing plate is disposed over the glass cell.

7. The LED package according to claim 6, wherein the polarizing plate is a reflective type polarizing plate.

8. The LED package according to claim 1, wherein a reflecting plate is disposed on a surface of the frame where the LED is mounted.

9. The LED package according to claim 1, wherein the glass cell includes two glass plates and a glass wall between the two glass plates, and wherein the two glass plates have a curved shape.

10. The LED package according to claim 1, wherein the organic solvent includes xylene.

11. The LED package according to claim 1, wherein a lower surface of the glass cell is disposed to coincide with a boundary between the vertical portion and the slanting portion.

12. A backlight unit comprising:
    a light emitting diode (LED) package, wherein the LED package comprises:
      a reflective frame having a light emitting diode (LED) thereon; and
      a glass cell over the LED, the glass cell including a quantum dot dispersed in one of a resin and an organic solvent,
      wherein the reflective frame includes a concave portion and a bottom surface on which the LED is mounted,
      wherein the glass cell is disposed inside the concave portion of the reflective frame,
      wherein a whole of the glass cell is disposed inside the concave portion of the reflective frame such that a top surface of the glass cell is flush with a top surface of a sidewall of the reflective frame,
    wherein an entire space between the LED and the glass cell is filled with an inert gas,
      wherein an inner side surface of the reflective frame has a vertical portion and a slanting portion that does not include a step or protrusion, and a length of a bottom surface of the glass cell is substantially the same as a length of a top surface of the space between the LED and the glass cell,
      wherein the vertical portion and the slanting portion of the inner side surface of the reflective frame are directly connected to each other without any intervening horizontal step portion such that the glass cell has a structure corresponding to the shape of the concave portion of the reflective frame, and
      wherein a lower edge of the glass cell is disposed at a connecting point of the vertical portion and the slanting portion such that a whole of a lower surface of the glass cell is exposed to the space between the LED and the glass cell.

13. A liquid crystal display device comprising:
    a backlight unit, wherein the backlight unit comprises a light emitting diode (LED) package, and wherein the LED package comprises:
      a reflective frame having a light emitting diode (LED) thereon; and a glass cell over the LED, the glass cell including a quantum dot dispersed in one of a resin and an organic solvent, wherein the reflective frame includes a concave portion and a bottom surface on which the LED is mounted, wherein the glass cell is disposed inside the concave portion of the reflective frame, wherein a whole of the glass cell is disposed inside the concave portion of the reflective frame such that a top surface of the glass cell is flush with a top surface of a sidewall of the reflective frame, wherein an entire space between the LED and the glass cell is filled with an inert gas, wherein an inner side surface of the reflective frame has a vertical portion and a slanting portion that does not include a step or protrusion, and a length of a bottom surface of the glass cell is substantially the same as a length of a top surface of the space between the LED and the glass cell, wherein the vertical portion and the slanting portion of the inner side surface of the reflective frame are directly connected to each other without any intervening horizontal step portion such that the glass cell has a structure corresponding to the shape of the concave portion of the reflective frame, and wherein a lower edge of the glass cell is disposed at a connecting point of the vertical portion and the slanting portion such that a whole of a lower surface of the glass cell is exposed to the space between the LED and the glass cell.

* * * * *